United States Patent [19]

Schwartzkopf et al.

[11] Patent Number: 4,959,293
[45] Date of Patent: Sep. 25, 1990

[54] DEEP UV PHOTORESIST WITH ALKYL 2-DIAZO-1-ONES AS SOLUBILITY MODIFICATION AGENTS

[75] Inventors: George Schwartzkopf, Franklin Township, Somerset County, N.J.; John B. Covington; Kathleen B. Gabriel, both of Bethlehem, Pa.

[73] Assignee: J. T. Baker, Inc., Phillipsburg, N.J.

[21] Appl. No.: 264,335

[22] Filed: Oct. 28, 1988

[51] Int. Cl.$^5$ .................. G03F 7/004; G03F 7/022; G03C 1/54
[52] U.S. Cl. ........................... 430/189; 430/165; 430/191; 430/192; 430/193; 430/326; 534/556
[58] Field of Search .............. 430/192, 193, 189, 191, 430/165; 534/556

[56] References Cited

U.S. PATENT DOCUMENTS

| | | | |
|---|---|---|---|
| 2,959,482 | 11/1960 | Neugebauer et al. | 96/33 |
| 3,201,239 | 8/1965 | Neugebauer et al. | 430/193 |
| 3,597,202 | 8/1971 | Cerwonka | 96/35.1 |
| 4,339,522 | 7/1982 | Balanson et al. | 430/192 |
| 4,624,908 | 11/1986 | Schwartzkopf | 430/192 |

OTHER PUBLICATIONS

Grant et al., "Deep UV Photoresists I. Meldrun's Diazo Sensitizer", IEEE Transactions on Electron Devices, vol. ED-28, No. 11, Nov. 1981.
Matlin, S. et al., J. Chem. Soc., Perkins Trans. 1(20), 2623–2630 (1972).
Stojiljkovic, A. et al., Tetrakedron 33(1), 65–7 (1977).
Marfisi, C. et al., J. Org. Chem., 48, 533–7 (1983).
Cava, M. et al., J. Org. Chem., 31(6), 2015–7 (1966).
Korobitsyna, I. K., et al., Zh. Org. Khim., 12, pp. 1245–1260, 1976.
Pacansky, J. et al., IBM J. Res. Dev., vol. 23, No. 1, 1/1979.

Primary Examiner—Charles L. Bowers, Jr.
Attorney, Agent, or Firm—Parmelee, Bollinger & Bramblett

[57] ABSTRACT

2-diazo-1-ones are useful deep UV photoresist solubility modification agents exhibiting improved photosensitivity allowing shorter deep UV exposure times to achieve the same extent of photoreaction as with prior art solubility modification agents. The 2-diazo-1-one solubility modification agents when used as photoactive solubility modification components in photoresist compositions permit the photoresist compositions to act as either positive or negative photoresist compositions depending upon the developer employed, namely, as a positive resist when a metal ion containing developer is employed and as a negative resist when a metal ion free developer is employed.

23 Claims, 4 Drawing Sheets

DEEP UV PHOTORESIST WITH ALKYL 2-DIAZO-1-ONES AS SOLUBILITY MODIFICATION AGENTS

FIELD OF THE INVENTION

This invention relates to 2-diazo-1-ones useful in photoresist compositions, particularly in deep UV photoresist systems, as solubility modification agents, to photoresist compositions containing such solubility modification agents and to a process for forming a lithographic resist image employing said photoresist compositions.

BACKGROUND OF THE INVENTION

For some time now, due to the rapid advances being made in the state of the art of the projection or lithographic printing field, it has become very desirable to be able to provide image geometries of less than about 1 micron and with very high device packing densities. In order to most advantageously obtain the same it has become desirable to employ projection imaging wavelengths in the deep ultra-violet (UV) region of below about 300 nm. Therefore, it has become necessary to provide solubility modification agents suitable for use with imaging wavelengths in the deep UV region.

The naphthodiazoquinones commonly used in non-deep UV resist compositions are of very limited usefulness in deep UV photoresists because of their excessive and non-bleachable deep UV absorbance. In U.S. Pat. No. 4,339,522 of R. Balamson et al., issued July 13, 1982 and assigned to International Business Machines Corporation, there is disclosed a deep UV resist composition which comprises phenolic-aldehyde resin sensitized with Meldrum's acid diazo or a homologue thereof. However, the image resolution characteristic of such a composition leaves much to be desired. More recently, in U.S. Pat. No. 4,624,908 of George Schwartzkopf, issued Nov. 25, 1986 and assigned to J. T. Baker Inc., there is disclosed deep UV positive photoresist compositions of improved image resolution characteristics providing good resolution of 0.75 micron lines or smaller. The novel solubility modification agents disclosed in said patent are certain 2-diazo-1,3-dione compounds.

However, it is desirable that deep UV solubility modification agents be available which possess greater photosensitivity than said 2-diazo-1,3-dione compounds, i.e. which exhibit a more rapid response to deep UV light thereby allowing shorter exposure times to achieve the same extent of photoreaction. Additionally, it is highly desirable that photoresist solubility modification agents be available which allow for image reversal (from positive to negative) to be achieved with these agents simply by changing developer type from metal ion containing to metal ion free developer. It is further desirable that deep UV photoresist solubility modification agents be available with the above-stated advantages and which also provide for the good image resolution of 0.75 micron lines or smaller.

SUMMARY OF THE INVENTION

Deep UV photoresist compositions that are sensitive to light in the deep UV range of from about 240–300 nm and which permit either positive or negative imaging are provided by photoresist compositions comprising a film-forming polymer and a solubility modification agent selected from the group consisting of compounds of the formula:

(Formula I)

wherein: X and Y are straight or branch chain alkyl or substituted alkyl radicals which may be joined together to form an unsubstituted or substituted straight or branched alkyl or fused ring alkyl chain and wherein the alkyl or fused ring alkyl radicals may be substituted with a radical selected from the group consisting wherein:
$R_1$ is a straight or branched chain alkyl radical of from 1 to about 20 carbon atoms or in which $R_2$ is alkyl of from 1 to 20 carbon atoms, preferably 1 to 10 carbon atoms and most preferably 2 to 6 carbon atoms;

$Z$ is $H_2$ or $N_2$;

$X$ and $Y$ are as defined hereinbefore; and $R_3$, $R_4$ and $R_5$ are each independently alkyl of from 1 to 20 carbon atoms, preferably of from 1 to 6 carbon atoms and more preferably of from 1 to 4 carbon atoms.

DETAILED DESCRIPTION OF THE INVENTION

The solubility modification agents of the above formula include preferred compounds of the following formulae:

(Formula II)

(Formula III)

(Formula IV)

(Formula V)

wherein:
- $R_6$ and $R_7$ are straight or branched alkyl radicals of from 1 to 20 carbon atoms which may be joined together to form an alkyl or fused ring alkyl radical;
- $R_8$ and $R_9$ are each independently alkyl of from 1 to 20 carbon atoms, preferably of from 1 to 10 carbon atoms and most preferably of from 2 to 6 carbon atoms;
- $R_{10}$, $R_{11}$ and $R_{12}$ are each independently alkyl of from 1 to 20 carbon atoms, preferably of from 1 to 6 carbon atoms and more preferably of from 1 to 4 carbon atoms;
- $R_{13}$ is hydrogen or alkyl of from 1 to 4 carbon atoms;
- $R_{14}$ is a valence bond or an alkyl radical of from 1 to 10 carbon atoms;
- $R_{15}$ is alkyl of from 1 to 10 carbon atoms or $-R_{16}OOCR_{14}R_{17}$ wherein $R_{16}$ is alkyl of from 1 to 10 carbon atoms, $R_{14}$ is as defined hereinbefore and $R_{17}$ is where $R_{13}$ is as defined hereinbefore.

As examples of preferred photoactive solubility modification agents of the previously set forth formulae, there may be mentioned for example:
diethyl 2-diazo-1-decalone-4,4-dicarboxylate;
methyl 3-diazo-1-methyl-2-oxocyclohexanepropionate;
2-diazocyclododecane-1-one;
2-diazocyclopentadecan-1-one;
9-diazo-10-nonadecanone;
13-diazo-14-heptacosanone;
2-diazo-5-alpha-cholestane-3-one;
2-diazo-4-tert-amylcyclohexan-1-one;
2-diazo-5-(tert-butyldimethylsilyloxy)-1-decalone;
3-diazo-1-methyl-2-oxocyclohexanecarboxylic Acid, 1,6-hexanediyl ester and monodiazo analog;
methyl 3-diazo-5,5,8a-trimethyl-2-decalone-1-carboxylate.

The photoactive solubility modification agents useful according to this invention are either known or can be readily prepared, such as for example, by treating any suitable sulfonylazide, such as p-toluenesulfonyl azide TSA) or naphthylenesulfonyl azide (NSA) with the appropriate readily available ketone under appropriate reaction conditions in the presence of a suitable solvent such as ethanol, benzene or acetonitrile and the like and a suitable catalyst such as a dry triethylamine and the like, followed by appropriate separation and purification steps. Generally after reacting for a period of about 3 to about 5 hours, the reaction mixture is filtered to remove the precipitated sulfonamide and the filtrate is evaporated to dryness. The product may then be partially purified by partitioning between ether and dilute alkali hydroxide. The residues may be purified either by recrystallization, if the product is a solid, or by chromatography, such as flash chromatography on silica gel if the product is an oil.

Exemplary of the preparation of compounds of Formula I for use as photoactive solubility modification agents according to the invention are the following preparations.

PREPARATION 1

Diethyl 2-Diazo-1-decalone-4,4-dicarboxylate

A solution of 3.0 gm (10.1 mmole) of diethyl 1-decalone -4,4-dicarboxylate in 60 mL of acetonitrile was cooled in an ice bath under nitrogen. This solution was treated dropwise with 1.54 gm (10.1 mmole) of 1,8-diazabicyclo[5.4.0]undec-7-ene. The solution was then stirred for about 5 minutes at about 5° C. after which time 2.19 gm (11.1 mmole) of p-toluenesulfonyl azide was added dropwise, keeping the temperature at less than about 10° C. The resulting solution was stirred for about 5 hours below about 10° C. and then allowed to come to room temperature overnight. After stirring overnight at room temperature, the mixture was concentrated to dryness in vacuo (less than 30° C.). The residue was dissolved in methylene chloride and washed with 1N NaOH. The aqueous layer was extracted with methylene chloride (3 times) and the combined organic layers were then washed with saturated brine. The organic layer was dried over sodium sulfate and concentrated in vacuo (less than 30° C.). The residue was subjected to flash chromatography on 40 microns silica gel yielding 1.2 gm of diethyl 2-diazo-1-decalone-4,4-dicarboxylate as a viscous, yellow oil. Elemental analysis calculated for $C_{16}H_{22}N_2O_5C$: 59.62; H: 6.88; N: 8.69. Found: C: 59.53; H: 6.97; N: 8.52. Pmr, cmr, ir, and UV spectra consistent with the desired product were obtained.

PREPARATION 2

Methyl 3-Diazo-1-methyl-2-oxocyclohexanepropionate

The subject compound was prepared in the manner described in Preparation 1 except that 1 gm (5.0 mmole) methyl 1-methyl-2-oxocyclohexanepropionate was employed as a starting material in place of diethyl 1-decalone-4,4-dicarboxylate. Chromatography of the reaction mixture gave 0.38 gm of the desired product as a viscous yellow oil. Pmr, cmr, ir, and UV spectra consistent with the desired product were obtained.

PREPARATION 3

2-Diazocyclododecane-1-one

A suspension of 1.3 gm (33 mmole) of sodium hydride dispersion (60%) in 12 mL of diethyl ether and one drop of absolute ethanol was cooled in an ice bath under nitrogen. A mixture was prepared of 2.0 gm (11 mmole) cyclododecanone and 2.4 gm (33 mmole of ethyl formate in 20 mL of diethyl ether. This second solution was added, dropwise, to the sodium hydride suspension. The resulting mixture was stirred in the ice bath for about 3 hours after which time it was allowed to come to room temperature. After stirring at room temperature overnight, a solution of 3.99 gm (33 mmole) p-toluenesulfonyl azide in 25 mL of diethyl ether was added dropwise. The resulting mixture was stirred at room temperature for about 3 hours. Ten mL of water was added and the organic layer removed. This organic layer was then washed with 100 mL of 10% NaOH. The aqueous layer was extracted with three portions of ethyl acetate. The combined organic phases were dried over sodium sulfate and then concentrated in vacuo (less than 30° C.). The residue was subjected to flash chromatography on 40 microns silica gel to give 1.0 gm of 2-diazocyclododecan-1-one as a bright yellow-orange solid, MP 43°–44° C. Elemental analysis calculated for $C_{12}H_{20}N_2O$: C: 69.19; H: 9.68; N: 13.45. Found: C: 69.13; H: 9.69; N: 13.57. Pmr, cmr, ir, and UV spectra consistent with the desired product were obtained.

PREPARATION 4

2-Diazocyclopentadecan-1-one

The subject compound was prepared in the manner described in Preparation 3 except that 2.09 gm (8.9 mmole) cyclopentadecanone was employed as a staring material in place of cyclododecanone. Chromatography of the reaction mixture gave 0.8 gm of the desired product as a viscous yellow oil. Satisfactory pmr, cmr, ir, and UV spectra were obtained.

PREPARATION 5

9-Diazo-10-nonadecanone

The subject compound was prepared in the manner described in Preparation 3 except that 2.0 gm (7.0 mmole) 10-nonadecanone was employed as a starting material in place of cyclododecanone. Chromatography of the reaction mixture gave 0.8 gm of the desired product as a viscous yellow oil. Pmr, cmr, ir, and UV spectra consistent with the desired product were obtained.

PREPARATION 6

13-Diazo-14-heptacosanone

The subject compound was prepared in the manner described in Preparation 3 except that 2.0 gm (5.0 mmole) 14-heptacosanone was employed as a starting material in place of cyclododecanone. Chromatography of the reaction mixture gave 0.25 gm of the desired product as a viscous yellow oil. Elemental analysis calculated for $C_{27}H_{52}N_2O$: C: 77.08; H: 12.46; N: 6.66. Found: C: 77.38; H: 12.51; N: 6.70. Pmr, cmr, ir, and UV spectra consistent with the desired product were obtained.

PREPARATION 7

2-Diazo-5-alpha-cholestane-3-one

The subject compound was prepared in the manner described in Preparation 3 except that 1.0 gm (2.6 mmole) 5-alpha-cholestane-3-one was employed as a starting material in place of cyclododecanone. Chromatography of the reaction mixture gave 0.3 gm of the desired product as a pale yellow solid, MP 105°–108° C. Elemental analysis calculated for $C_{27}H_{43}N_2O$: C: 78.59; H: 10.75; N: 6.79. Found: C: 78.33; H: 10.44; N: 6.70. Pmr, cmr, ir, and UV spectra consistent with the desired product were obtained.

PREPARATION 8

2-Diazo-4-tert-amylcyclohexan-1-one

The subject compound was prepared in the manner described in Preparation 3 except that 2.0 gm (12.0 mmole) 4-tert-amylcyclohexan-1-one was employed as a starting material in place of cyclododecanone. Chromatography of the reaction mixture gave 0.5 gm of the desired product as a viscous yellow oil. Pmr, cmr, ir, and UV spectra consistent with the desired product were obtained.

PREPARATION 9

2-Diazo-5-(tert-butyldimethylsilyloxy)-1-decalone

A suspension of 0.45 gm (12 mmole) of sodium hydride dispersion (60%) in 75 mL of tetrahydrofuran was treated with 2.0 gm (12 mmole) of 1,5-decalindiol in an inert atmosphere. This mixture was stirred overnight at about 56° C. then cooled to room temperature and 1.8 gm (12 mmole) of t-butyldimethylsilyl chloride added. The mixture was stirred at room temperature for 4 days then 200 mL of diethyl ether added followed by washing the resulting mixture with 10% aqueous potassium carbonate. The organic layer was dried over sodium sulfate and concentrated in vacuo. The residue was subjected to flash chromatography on 40 microns silica gel to give 5-(t-butyldimethylsilyloxy)-1 -hydroxydecalin as a clear, colorless oil. Satisfactory ir, cmr and pmr spectra were obtained.

A solution of 0.8 gm (2.8 mmole) of this intermediate, 0.5 gm (4.2 mmole) of 4-ethyl morpholine N-oxide, and 20 mL of methylene chloride were stirred under nitrogen for about 5 minutes. Two grams of 4A molecular sieves were added and stirring continued for about 10 minutes. A 5.3 mg portion of tetrapropyl ammonium perruthenate was added and stirring continued at room temperature overnight. The next day the mixture was filtered and the solution washed two times with 5% aqueous sodium sulfite. The organic layer was then washed two times with saturated brine and two times with saturated cupric sulfate solution. The solution was dried over sodium sulfate and concentrated in vacuo. The material was subjected to flash chromatography on 40 microns silica gel to give 5-(t-butyl dimethylsilyloxy)-1-decalone as a clear, colorless oil. Elemental analysis calculated for $C_{16}H_{30}O_2Si$: C: 68.03; H: 10.70. Found: C: 68.09; H: 10.61. Confirming pmr, cmr, ir spectra were obtained.

The subject compound, 2-diazo-5-(tert-butyldimethyl silyloxy)-1-decalone, was then prepared in the manner described in Preparation 3 except that this intermediate, 2.0 gm (7.0 mmole) 5-(t-butyldimethylsiloxy)-1-decalone was employed as a starting material in place of cyclododecanone. Chromatography of the reaction mixture gave 0.65 gm of the desired product as a viscous yellow oil. Pmr, cmr and ir spectra consistent with the desired product were obtained.

PREPARATION 10

3-Diazo-1-methyl-2-oxocyclohexanecarboxylic Acid, 1,6-Hexanediyl Ester and Monodiazo Analog A solution of 6 gm (36 mmole) of ethyl 2-oxocyclohexanecarboxylate (containing 40% of the methyl ester), 4.4 gm (36 mmole) of 2-dimethylaminopyridine, 2.1 gm (18 mmole) of 1,6-hexanediol and 550 mL of dry toluene was refluxed through a soxhlet apparatus containing 87 gm of 4A molecular sieves in the thimble. After 4 days the reaction mixture was concentrated in vacuo to 250 mL and washed 3 times with saturated aqueous ammonium chloride. The organic layer was dried over sodium sulfate and concentrated in vacuo. The residue was subjected to flash chromatography on 40 microns silica gel to give 2-oxocyclohexanecarboxylic acid, 1,6-hexanediyl ester as a clear, colorless oil. Elemental analysis calculated for $C_{20}H_{30}O_6$: C: 65.55; H: 8.25. Found: C: 66.01; H: 8.54. Satisfactory pmr, cmr and ir spectra were obtained.

A 5 mL portion of water washed Amberlite IRA-900 ion exchange resin was further washed with 1N NaOH to convert the resin to the free base form, then washed with water until a neutral pH was obtained. The resin was then washed with 50–100 mL of ethanol followed by a solution of 2.0 gm (5 mmole) of the previously prepared 2-oxocyclohexanecarboxylic acid, 1,6-hexanediyl ester in 20 mL of ethanol. Washing with ethanol was continued until the eluent was free of ester. (About half of the ester remained bound to the resin). The resin was then transferred to a flask containing 12 mL of ethanol and 1.4 gm (10 mmole) of iodomethane. This mixture was stoppered and shaken for about 28 hours. The resin was removed by filtration and the filtrate concentrated. The residue was subjected to flash chromatography on 40 microns silica gel giving 1-methyl-2-oxocyclohexanecarboxylic acid, 1,6-hexanediyl ester as a clear colorless oil. Elemental analysis calculated for $C_{22}H_{34}O_6$: C: 66.98; H: 8.69. Found: C: 67.02; H: 8.98. Confirming pmr, cmr, ir and mass spectra were obtained.

The subject compound, 3-diazo-1-methyl-2-oxocyclohexanecarboxylic acid, 1,6-hexanediyl ester, was prepared in the manner described in Preparation 1 except that 1.3 gm (3.3 mmole) the preceding intermediate, 1-methyl-2-oxocyclohexanecarboxylic acid, 1,6-hexanediyl ester was employed as a starting material in place of diethyl 1-decalone-4,4-dicarboxylate. Chromatography of the reaction mixture gave 0.2 gm of the desired product as a viscous yellow oil as well as 0.25 gm of the monodiazo analog resulting from diazotransfer to only one of the cyclohexane rings. Pmr, cmr, ir, and UV spectra consistent with the desired products were obtained on both reaction products.

PREPARATION 11

Methyl 3-Diazo-5,5,8a-trimethyl-2-decalone-1-carboxylate

The subject compound was prepared in the manner described in Preparation 1 except that 1.8 gm (7.1 mmole) methyl 5,5,8a-trimethyl-2-decalone-1-carboxylate was employed as a starting material in place of diethyl 1-decalone-4,4-dicarboxylate. Chromatography of the reaction mixture gave 0.8 gm of the desired product as a viscous yellow oil. Elemental analysis calculated for C: 64.73; H: 7.97; N: 10.06. Found: C: 64.62; H: 7.99; N: 10.11. Pmr, cmr, ir, and UV spectra consistent with the desired product were obtained.

When the photoactive solubility modification agents of this invention are added to base soluble acidic polymers and the resulting photoresist compositions are cast as films on substrates, the photoactive solubility modification agents change the solubility of the polymeric film in developer in the area of the film which has not been exposed to the deep UV light compared to the area of the polymeric film exposed to UV light. This change in solubility is caused by a photoreaction in which the initially present agent is converted to another species which possesses different base solubility and may lead to either a positive or negative a photoresist depending on which combination of photoactive agent and developer is used.

Any suitable base soluble acidic photoresist polymer can be employed in the photoresist compositions of this invention, such as the commercially available phenol-formaldehyde resins, cresol-formaldehyde resins, poly(vinylphenol), and copolymers of methacrylic acid with other acrylate monomers, such as, poly(methyl methacrylate-methacrylic acid) and poly(methacrylonitrile-methacrylic acid) resins and the like. A particularly preferred resin is a poly(vinylphenol) resin commercially available from Hoechst Celanese Fine Chemicals, Corpus Christi, Texas, as poly(p-hydroxystyrene). Also preferred is a poly(methyl methacrylate-methacrylic acid) resin having a methacrylic acid content of between about 20 to 30%, preferably about 25% by weight, having a molecular weight (by gel permeation chromatography) of between about 20,00% to 120,000, preferably about 80,000, and having a narrow polydispersity. Such a resin is one prepared according to the following method. A solution of 4.9 liters of the appropriate amounts of methyl methacrylate and methacrylic acid (a total of 17.5 moles of the two monomers) is stirred under $N_2$ at 80°±2° C. as 300 mL aliquots of a solution of the appropriate amount of 2,2-diazo bis(2-methylpropionitrile) (3.5 gm for a polymer with a molecular weight of 80,000 or 16.5 for a polymer with a molecular weight of 20,000) in 2100 mL of 1,2-dimethoxyethane were added at 30 minutes intervals. When the addition is completed, the reaction mixture is stirred at 80°±2° C. for an additional 16 hours before being evaporated to dryness. The residue is washed with 15 liters of dichloromethane for 24 hours and then the wash is decanted and discarded. The insoluble polymer is dissolved in 15 liters of methanol and the solution is filtered. The filtrate is evaporated to dryness to yield the polymeric product.

The photoresist compositions of this invention comprise about 50 to 85% by weight base soluble acidic polymer and from about 15 to about 50% by weight of a solubility modification agent of this invention, preferably about 70% base soluble acid polymer and about 30% solubility modification agent. The resists may be formed readily by dissolving the polymer and solubility modification agent in a common solvent and casting a film onto an appropriate substrate. Any suitable film-forming solvent may be used, generally film-forming solvents having a boiling point of from about 120° C. to 210° C., such as for example, diglyme, methyl isobutyl ketone, 2-ethoxyethanol, 2-methoxyethyl acetate, γ-butyrolactone, 2-ethoxyethylacetate, ethyl lactate, ethyl 3-ethoxypropionate, propylene glycol ether and ether-acetate, cyclopentanone, cyclohexanone, dimethyl formamide, dimethyl acetamide, N-methylpyrrolidinone, and the like. The resist forming composition will generally comprise from about 50 to about 95% by weight solvent and about 5 to about 50% by weight solid (i.e. base soluble polymer and solubility modification agent combined). Preferably the solvent will comprise about 80 to 85% by weight and the solids about 15 to 20% by weight. The amount of solids employed will be dependent upon the desired viscosity of the resist forming composition and is such as permits the casting of a resist of about 1 micron thick.

An especially preferred resist composition of this invention comprises about 73% by weight diglyme solvent about 19% by weight poly(p-hydroxystyrene) and about 8% by weight diethyl 2-diazo-1-decalone-4,4-dicarboxylate.

The solubility modification agents of this invention, a series of 2-diazo-1-ones, possess greater photosensitivity compared to compounds previously proposed for such use, such as the 2-diazo-1,3-diones disclosed in the aforementioned U.S. Pat. No. 4,624,908. When incorporated into castable resist compositions with film-forming polymer and an appropriate film-forming solvent and subject to pre-baking to set the photoresist on the substrate, the greater photosensitivity of the solubility modification agents according to this invention results in cured photoresist with a more rapid response to deep UV light allowing shorter exposure times to achieve the same extent of photoreaction.

Solutions of the solubility modification agents of Preparations 1, 3, 6, 7 and 10, as well as ethyl 3-diazo-2,4-dioxodecalincarboxylate of U.S. Pat. No. 4,624,908 in a 14% solution of poly(methylmethacrylate)-copoly(-methacrylic acid) (3:1) in diglyme were each prepared at identical concentrations of the solubility modification agent (0.3×the weight of polymer present). The solutions were spun onto quartz wafers at about 2500 RPM to produce high quality films about a micron thick. The wafers were dried either at room temperature for one hour (Preparations 3 and 6) or at 78°.C. for 30 minutes (Preparations 1, 7 and 10). The UV absorbance at the diazo maximum wavelength (280–290 nm for the subject compounds, 260 nm for ethyl 3-diazo-2,4-dioxodecalincarboxylate) was measured on the film using a matched quartz wafer as the blank. The wafers were then irradiated with light from a high pressure mercury-xenon lamp using a deep UV filter for various times giving a series of doses. After each dose the UV absorbance was again measured on the film using a matched quartz wafer as the blank.

Figure 1:
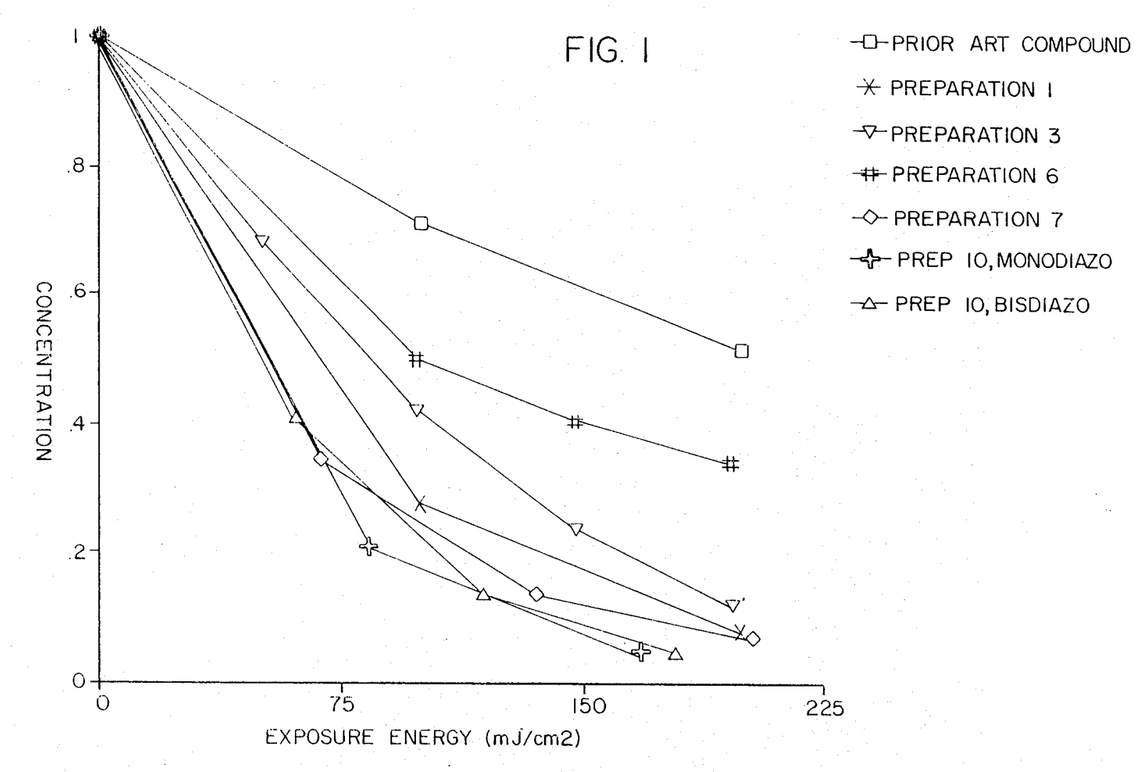
FIG. 1 is a plot of concentration of solubility modification agent remaining after exposure at various exposure doses.
Figure 2:
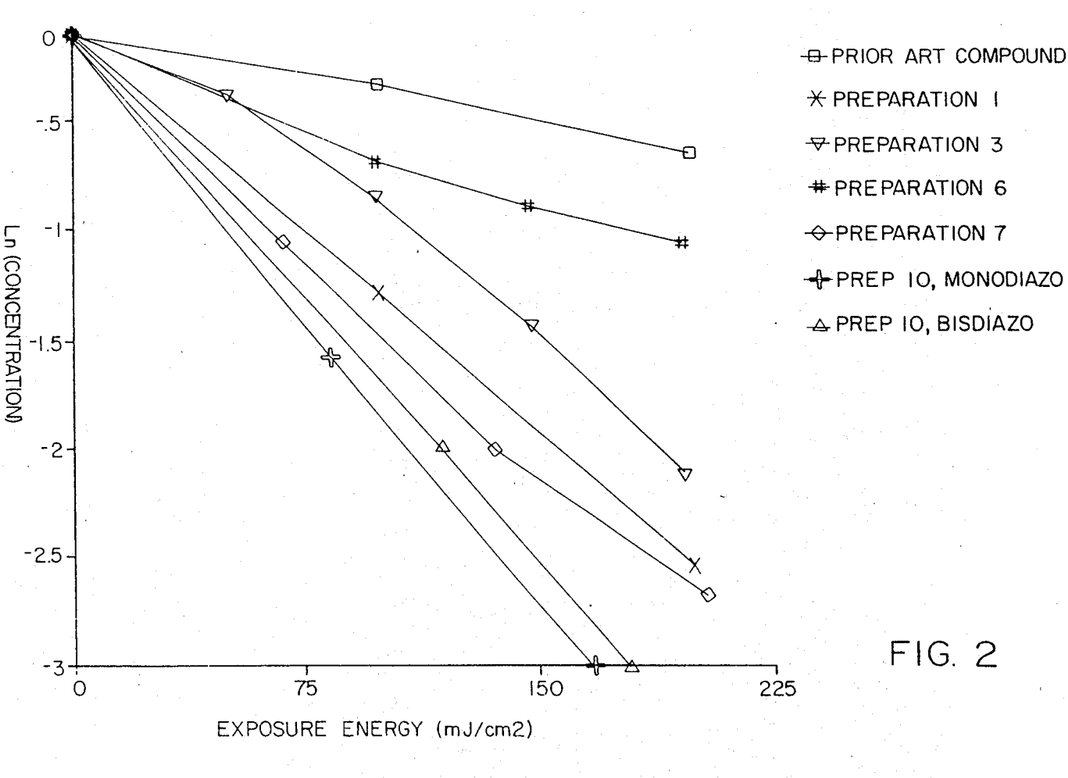
FIG. 2 is a plot of the relative first order rate of photolysis of solubility modification agents at various exposure doses based on the data of FIG. 1.

From these UV absorbance measurements the concentration of solubility modification agent remaining after each dose could be calculated by use of the equation:

Concentration = absorbance after irradiation/initial absorbance where initial concentration is normalized to 1.00. These concentrations are plotted versus their corresponding exposure energies in FIG. 1. This figure demonstrates that in every case the solubility modification agent compounds of this invention, the 2-diazo-1-ones, respond more rapidly to deep UV light than the prior art 2-diazo-1,3-dione, ethyl 3-diazo-2,4-dioxodecalincarboxylate. The relative first order rate of photolysis of these compounds was determined by plotting the natural logarithm of the concentration versus dose (FIG. 2) and determining the slope of the curve. This gave the following rates which demonstrate further the higher photoreactivity of the 2-diazo-1-one solubility modification agents of this invention versus prior art compounds:

| Preparation No. | Relative Rate of Photolysis |
| --- | --- |
| 1 | .012 |
| 3 | .011 |
| 6 | .006 |
| 7 | .013 |
| 10 - monodiazo | .018 |
| 10 - bisdiazo | .017 |
| ethyl 3-diazo-2,4-dioxodecalincarboxylate | .003 |

Lithographic resist compositions as described in the preceding paragraphs were prepared and cast as films onto appropriate wafer substrates and pre-baked at a temperature of about 78° C. for a period of about 30 minutes to drive off most of the solvent and then tested for usefulness as deep UV resists as described in the following procedures. Using a source of deep UV radiation, either a high-pressure mercury-xenon lamp with a deep UV filter or a KrF eximer laser, three-inch wafers with 0.8 to 1.1 micron thick resist films were exposed through a Ditric multidensity quartz mask giving sixteen different exposure zones on each wafer. Images were formed in the resists after developing for from about 10 to 550 seconds in an alkaline developer, such as for example, aqueous amines including triethanolamine, diethanolamine, monoethanolamine, and ammonia, aqueous tetra-alkylammonium hydroxides including tetramethylammonium, tetrabutylammonium, choline, methyl triethanolammonium, and tetraethanolammonium hydroxides, and commercial metal ion containing developers such as the J. T. Baker, Inc. product, Baker PRD. Wafers were developed by hand or in a commercial Model 5900 Development Rate Monitor of Perkin-Elmer Corporation.

The resist compositions so prepared and tested were as described in the following table of Examples.

TABLE

Examples 1 to 3

| Example Number | Photoactive Agent Preparation No. | Agent Amount | Polymer Amount* | Solvent | Solvent Amount |
| --- | --- | --- | --- | --- | --- |
| 1,2 | 1 | 0.41 gm | 0.96 gm | diglyme | 3.75 gm |
| 3 | 7 | 0.31 gm | 0.72 gm | diglyme | 2.82 gm |

*commercial poly(p-hydroxystyrene)-Hoeschst Celanese Fine Chemicals.

EXAMPLE 1

The formulation from Preparation Compound 1 was spun onto a silicon dioxide wafer and baked in a convection oven for 30 minutes at about 78° C. giving a 1002 nm thick resist film. This wafer was exposed through the Ditric mask to light from the high-pressure mercury-xenon lamp filtered through a deep UV filter transmitting from 240–300 nm. The exposed film was developed in 0.09M aqueous tetramethylammonium hydroxide in the Development Rate Monitor and negative tone was observed. The following clearing times were observed for the sixteen different exposures generated by the mask:

| Zone No. | Clearing Time (sec) | Exposure Energy (mJ/cm$^2$) |
| --- | --- | --- |
| 1 | 98 | 3 |
| 2 | 99 | 16 |
| 3 | 110 | 32 |
| 4 | 120 | 40 |

-continued

| Zone No. | Clearing Time (sec) | Exposure Energy (mJ/cm$^2$) |
|---|---|---|
| 5 | 143 | 46 |
| 6 | 149 | 51 |
| 7 | 170 | 59 |
| 8 | 195 | 64 |
| 9 | 216 | 71 |
| 10 | 266 | 80 |
| 11 | 336 | 93 |
| 12 | 432 | 112 |
| 13 | 544 | 132 |
| 14 | >600 | 166 |
| 15 | >600 | 214 |
| 16 | >600 | 313 |

Figure 3:
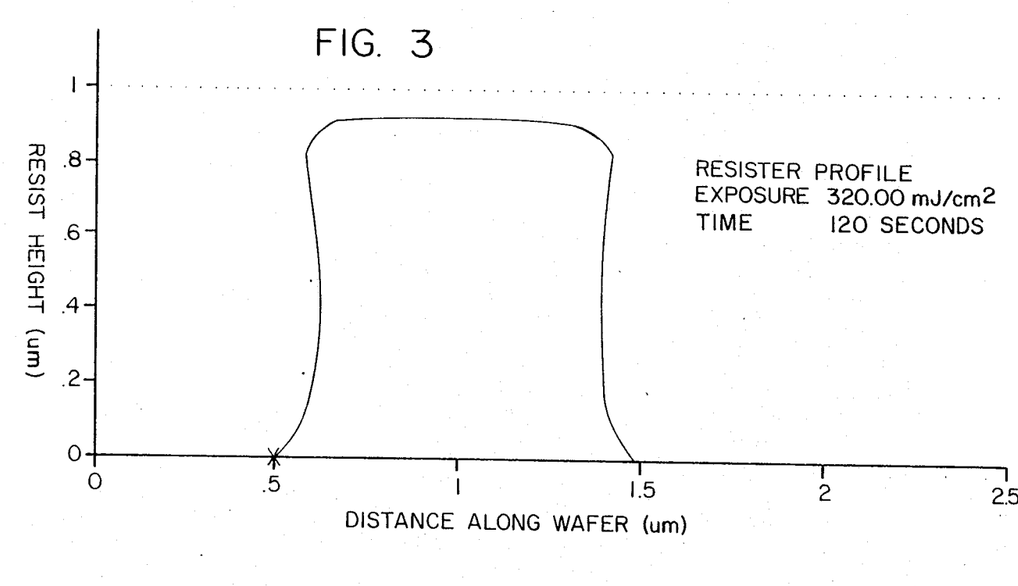
FIG. 3 is a plot of resist height versus the distance along the wafer showing the resist profile obtained using a solubility modification agent of this invention.

Data analysis indicated a high contrast negative resist that could operate with less than 10% thinning during development. After 120 seconds of development fully exposed Zone 16 had a thickness of 961 nm or only 4% thinning. The data was modeled for deep UV exposure on the Perkin-Elmer Corporation Micralign 500 projection aligner using PROSIM V 1.2 software (Perkin-Elmer Corporation) giving the result shown in FIG. 3. This data is consistent with typical negative photoresist behavior which is associated with the use of the combination of the subject photoresist compositions and metal ion free developers.

EXAMPLE 2

The formulation from Preparation Compound 1 was spun onto a silicon dioxide wafer and baked in a convection oven for 30 minutes at 78° C. giving a 992 nm thick resist film. This wafer was exposed through the Ditric mask to light from the KrF laser. The exposed film was developed in the Development Rate Monitor using ten parts of water and one part of a commercial metal ion containing developer (Baker PRD, J. T. Baker Inc., Phillipsburg, N.J.) and a positive tone was observed. The following clearing times were observed for the sixteen different exposures generated by the mask:

| Zone No. | Clearing Time (sec) | Exposure Energy (mJ/cm$^2$) |
|---|---|---|
| 1 | 512 | 3 |
| 2 | 467 | 16 |
| 3 | 394 | 33 |
| 4 | 381 | 41 |
| 5 | 349 | 47 |
| 6 | 326 | 53 |
| 7 | 294 | 61 |
| 8 | 274 | 67 |
| 9 | 256 | 73 |
| 10 | 229 | 82 |
| 11 | 213 | 97 |
| 12 | 187 | 116 |
| 13 | 178 | 137 |
| 14 | 141 | 172 |
| 15 | 117 | 222 |
| 16 | 73 | 324 |

Figure 4:
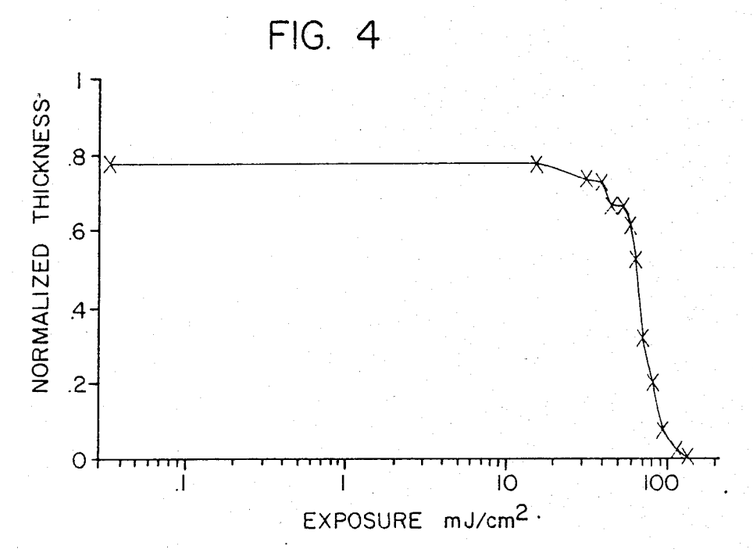
FIG. 4 is a plot of a typical contrast curve of a resist composition of this invention obtained by plotting normalized thickness versus log of the exposure dose.

Data analysis indicated a high contrast positive resist that could operate with less than 10% thinning during development. After 117 seconds, developed unexposed Zone 1 has a thickness of 910 nm or only 8% thinning. A typical contrast curve is shown in FIG. 4 (gamma =3.28). This data is consistent with typical positive photoresist behavior which is associated with the use of the combination of the subject photoresist compositions and metal ion containing developers.

EXAMPLE 3

The procedure was similar to Example 1 using the formulation from Preparation Compound 7. The resulting 1088 nm film was exposed to a deep UV lamp as in Example 1 then developed in the Development Rate Monitor using two parts of water and one part of a commercial metal ion containing developer (Baker PRD, J. T. Baker Inc., Phillipsburg, N.J.) and a positive tone was observed. The following clearing times were observed for the sixteen different exposures generated by the mask:

| Zone No. | Clearing Time (sec) | Exposure Energy (mJ/cm$^2$) |
|---|---|---|
| 1 | 110 | 3 |
| 2 | 78 | 16 |
| 3 | 54 | 32 |
| 4 | 52 | 40 |
| 5 | 48 | 46 |
| 6 | 46 | 51 |
| 7 | 44 | 59 |
| 8 | 43 | 65 |
| 9 | 42 | 71 |
| 10 | 41 | 80 |
| 11 | 39 | 94 |
| 12 | 38 | 112 |
| 13 | 37 | 132 |
| 14 | 36 | 166 |
| 15 | 35 | 214 |
| 16 | 34 | 313 |

This data is consistent with typical positive photoresist behavior which is associated with the use of the combination of the subject photoresist compositions and metal ion containing developers.

What is claimed is:

1. A lithographic deep UV light sensitive positive photoresist composition for use with deep UV light of less than 300 nm comprising a base soluble film-forming photoresist polymer and in admixture therewith an effective amount of a deep UV photosensitive solubility modification agent compound of the formula:

(Formula I)

wherein:

X and Y are straight or branch chain alkyl or substituted alkyl radicals which may be joined together to form an unsubstituted or substituted straight or branched alkyl or fused ring alkyl chain and wherein the alkyl or fused ring alkyl radicals may be substituted with a radical selected from the group consisting of —COOR$_1$ or wherein:

R$_1$ is a straight or branched chain alkyl radical of from 1 to about 20 carbon atoms or in which $R_2$ is alkyl of from 1 to 20 carbon atoms;
$Z$ is $H_2$ or $N_2$;
$X$ and $Y$ are as defined hereinbefore; and
$R_3$, $R_4$ and $R_5$ are each independently alkyl of from 1 to 20 carbon atoms.

2. A composition of claim 1 wherein the base soluble film-forming polymer is a resin selected from the group consisting of phenol-formaldehyde, cresol-formaldehyde, poly(vinylphenol) and poly(methyl methacrylate-methacrylic acid) resins.

3. A composition of claim 1 wherein the solubility modification agent is present in an amount of from about 15 to about 50% by weight based on the combined weight of polymer and agent.

4. A composition of claim 2 wherein the solubility modification agent is present in an amount of from about 15 to about 50% by weight based on the combined weight of polymer and agent.

5. A composition of claim 1 wherein the solubility modification agent is a compound of the formula:

(Formula II)

wherein:
$R_6$ and $R_7$ are straight or branched alkyl radicals of from 1 to 20 carbon atoms which may be joined together to form an alkyl or fused ring alkyl radical.

6. A composition of claim 1 wherein the solubility modification agent is a compound of the formula:

(Formula III)

wherein:
$R_8$ and $R_9$ are each independently alkyl of from 1 to 20 carbon atoms.

7. A composition of claim 1 wherein the solubility modification agent is a compound of the formula:

(Formula IV)

wherein:
$R_{10}$, $R_{11}$ and $R_{12}$ are each independently alkyl of from 1 to carbon atoms.

8. A composition of claim 1 wherein the solubility modification agent is:

(Formula V)

wherein:
$R_{13}$ is hydrogen or alkyl of from 1 to 4 carbon atoms;
$R_{14}$ is a valence bond or an alkyl radical of from 1 to 10 carbon atoms;
$R_{15}$ is alkyl of from 1 to 10 carbon atoms or $-R_{16}OOCR_{14}R_{17}$ wherein $R_{16}$ is alkyl of from 1 to 10 carbon atoms, $R_{14}$ is as defined hereinbefore and $R_{17}$ is where $R_{13}$ is as defined hereinbefore.

9. A composition of claim 1 wherein the solubility modification agent is selected from the group consisting of:
diethyl 2-diazo-1-decalone-4,4-dicarboxylate;
methyl 3-diazo-1-methyl-2-oxocyclohexanepropionate;
2-diazocyclododecane-1-one;
2-diazocyclopentadecan-1-one;
9-diazo-10-nonadecanone;
13-diazo-14-heptacosanone;
2-diazo-5-alpha-cholestane-3-one;
2-diazo-4-tert-amylcyclohexan-1-one;
2-diazo-5-(tert-butyldimethylsilyloxy)-1-decalone;
3-diazo-1-methyl-2-oxocyclohexanecarboxylic acid, 1,6-hexanediyl ester and monodiazo analog;
methyl 3-diazo-5,5,8a-trimethyl-2-decalone-1-carboxylate.

10. A composition of claim 1 wherein the solubility modification agent is diethyl 2-diazo-1-decalone-4,4-dicarboxylate.

11. A composition of claim 2 wherein the solubility modification agent is diethyl 2-diazo-1-decalone-4,4-dicarboxylate.

12. A composition of claim 11 wherein the polymer is a poly(p-hydroxystyrene).

13. A composition of claim 12 wherein the composition comprises about 73% by weight diglyme solvent about 19% by weight poly(p-hydroxystyrene) and about 8% by weight diethyl 2-diazo-1-decalone-4,4-dicarboxylate.

14. A castable resist composition comprising the lithographic resist composition of claim 1 in film-forming solvent having a boiling point of from about 120° C. to 210° C.

15. A castable resist composition of claim 14 wherein the solvent comprises from about 50 to about 95% by weight of the castable composition.

16. A castable resist composition of claim 15 wherein the solvent is selected from the group consisting of diglyme, methyl isobutyl ketone, 2-ethoxyethanol, 2-methoxyethyl acetate, γ-butyrolactone, 2-ethoxyethylacetate, ethyl lactate, ethyl 3-ethoxypropionate, propylene glycol ether and ether-acetate, cyclopentanone, cyclohexanone, dimethyl formamide, dimethyl acetamide and N-methylpyrrolidinone.

17. A castable resist composition of claim 16 wherein the solubility modification agent is diethyl 2-diazo-1-decalone-4,4-dicarboxylate.

18. A castable resist composition comprising the lithographic resist composition of claim 1 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate, γ-butyrolactone, 2-ethoxyethylacetate, ethyl lactate, ethyl 3-ethoxypropionate, propylene glycol ether and ether-acetate, cyclopentanone, cyclohexanone, dimethyl formamide, dimethyl acetamide and N-methylpyrrolidinone.

19. A castable resist composition comprising the lithographic resist composition of claim 5 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate, γ-butyrolactone, 2-ethoxyethylacetate, ethyl lactate, ethyl 3-ethoxypropionate, propylene glycol ether and ether-acetate, cyclopentanone, cyclohexanone, dimethyl formamide, dimethyl acetamide and N-methylpyrrolidinone.

20. A castable resist composition comprising the lithographic resist composition of claim 6 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate, γ-butyrolactone, 2-ethoxyethylacetate, ethyl lactate, ethyl 3-etoxypropionate, propylene glycol ether and ether-acetate, cyclopentanone, cyclohexanone, dimethyl formamide, dimethyl acetamide and N-methylpyrrolidinone.

21. A castable resist composition comprising the lithographic resist composition of claim 7 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate, γ-butyrolactone, 2-ethoxyethylacetate, ethyl lactate, ethyl 3-ethoxypropionate, propylene glycol ether and ether-acetate, cyclopentanone, cyclohexanone, dimethyl formamide, dimethyl acetamide and N-methylpyrrolidinone.

22. A castable resist composition comprising the lithographic resist composition of claim 8 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate, γ-butyrolactone, 2-ethoxyethylacetate, ethyl lactate, ethyl 3-ethoxypropionate, propylene glycol ether and ether-acetate, cyclopentanone, cyclohexanone, dimethyl formamide, dimethyl acetamide and N-methylpyrrolidinone.

23. A castable resist composition comprising the lithographic resist composition of claim 9 in a film-forming solvent having a boiling point of from about 120° to 210° C. and wherein the solvent comprises from about 50% to about 95% by weight of the castable composition and is selected from the group consisting of diglyme, methyl isobutyl ketone, 2-ethoxyethanol, 2-methoxyethyl acetate, γ-butyrolactone, 2-ethoxyethylacetate, ethyl lactate, ethyl 3-ethoxypropionate, propylene glycol ether and ether-acetate, cyclopentanone, cyclohexanone, dimethyl formamide, dimethyl acetamide and N-methylpyrrolidinone.

* * * * *